United States Patent
Shiono et al.

(10) Patent No.: US 7,198,997 B2
(45) Date of Patent: Apr. 3, 2007

(54) METHOD FOR PRODUCING SEMICONDUCTOR SUBSTRATE, METHOD FOR PRODUCING FIELD EFFECT TRANSISTOR, SEMICONDUCTOR SUBSTRATE, AND FIELD EFFECT TRANSISTOR

(75) Inventors: Ichiro Shiono, Tokyo (JP); Masaharu Ninomiya, Tokyo (JP); Hazumu Kougami, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/536,445

(22) PCT Filed: Nov. 29, 2002

(86) PCT No.: PCT/JP02/12542

§ 371 (c)(1),
(2), (4) Date: May 25, 2005

(87) PCT Pub. No.: WO2004/049411

PCT Pub. Date: Jun. 10, 2004

(65) Prior Publication Data

US 2006/0022200 A1    Feb. 2, 2006

(30) Foreign Application Priority Data

Nov. 28, 2002    (JP)    ............................. 2002-345115

(51) Int. Cl.
*H01L 21/336* (2006.01)
(52) U.S. Cl. ...................................... 438/197
(58) Field of Classification Search ................. 257/194; 438/197
See application file for complete search history.

(56) References Cited

U.S. PATENT DOCUMENTS

| 5,221,413 A | 6/1993 | Brasen et al. |
| 5,442,205 A | 8/1995 | Brasen et al. |
| 6,690,043 B1 * | 2/2004 | Usuda et al. ............... 257/194 |

(Continued)

FOREIGN PATENT DOCUMENTS

CN    1336684    2/2002

(Continued)

*Primary Examiner*—Carl Whitehead, Jr.
*Assistant Examiner*—Monica D. Harrison
(74) *Attorney, Agent, or Firm*—Pillsbury Winthrop Shaw Pittman, LLP

(57) ABSTRACT

In a semiconductor substrate, a field effect transistor, and methods for producing the same, in order to lower threading dislocation density and also to lower surface roughness, a step of repeating, a plurality of times, a process of epitaxially growing a SiGe gradient composition layer of which a Ge composition ratio is gradually increased from a Ge composition ratio of a base material and a process of epitaxially growing a SiGe constant-composition layer on the gradient composition layer at a final Ge composition ratio of the gradient composition layer, thereby depositing a SiGe layer of which a Ge composition ratio changes in a film deposition direction, in a step-like manner with a gradient, a heat treatment step of performing heat treatment at a temperature exceeding a temperature of the epitaxial growth either during or after formation of the SiGe layer, and a polishing step of polishing to remove irregularities on a surface of the SiGe layer which arise in the heat treatment after formation of the SiGe layer are included.

12 Claims, 7 Drawing Sheets

U.S. PATENT DOCUMENTS

2002/0017642 A1    2/2002    Mizushima et al.

FOREIGN PATENT DOCUMENTS

| | | |
|---|---|---|
| DE | 10137369 | 4/2002 |
| JP | 06-252046 | 9/1994 |
| JP | 9-321307 | 12/1997 |
| JP | 2002-118254 | 4/2002 |
| JP | 2002-289533 | 10/2002 |
| JP | 2003-158075 | 5/2003 |
| KR | 2002-011338 A | 2/2002 |
| WO | WO 98/00857 | 1/1998 |

* cited by examiner

METHOD FOR PRODUCING SEMICONDUCTOR SUBSTRATE, METHOD FOR PRODUCING FIELD EFFECT TRANSISTOR, SEMICONDUCTOR SUBSTRATE, AND FIELD EFFECT TRANSISTOR

CROSS REFERENCE TO RELATED APPLICATIONS

This is the U.S. National Phase of PCT/JP02/12542, filed Nov. 29, 2002, which, in turn, claims priority to Japanese Patent Application No. 2002-345115, filed Nov. 28, 2002, the contents of both of which are incorporated herein by reference in their entireties.

This application is also related to Japanese Patent Application No. 2000-233640, filed Aug. 1, 2000, Japanese Patent Application No. 2001-165695, filed May 31, 2001, Japanese Patent Application No. 2001-253175, filed Aug. 23, 2001, and Japanese Patent No. 2002-238118, filed Aug. 19, 2002, the contents of all of which are incorporated herein by reference in their entireties. However, the present application does not claim priority from any of these four related Japanese applications.

TECHNICAL FIELD

This invention relates to semiconductor substrates used in high-speed MOSFET, and to field effect transistors, as well as to a method for forming SiGe layers appropriate to strained Si layers, to a method for forming strained Si layers using same, and to a method for producing field effect transistors.

BACKGROUND ART

In recent years there have been proposals of high-speed MOSFETs, MODFETs, and HEMTs employing, in the channel region, a strained Si (silicon) layer grown epitaxially on Si substrate with a SiGe (silicon-germanium) layer intervening. In a strained-Si FET, tensile stress arises in the Si layer due to the SiGe, which has larger lattice constants than does Si, and consequently the band structure in the Si changes, state degradation is removed, and carrier mobilities are increased. Hence by using such a strained Si layer as a channel region, operation can be made faster by a factor of 1.5 to 1.8 compared with normal devices. Moreover, normal Si substrate grown using the CZ method can be employed as the substrate, so that conventional CMOS processes can be employed to realize high-speed CMOS devices.

However, in order to achieve epitaxial growth of the desired strained Si layer described above as the channel region of a FET, a good-quality SiGe layer must be grown epitaxially on the Si substrate; but differences in the lattice constants of Si and SeGe have resulted in crystallinity-related problems such as dislocations. Consequently in the past there have been various proposals such as the following.

Methods which have been proposed include, for example, a method of using a buffer layer in which the Ge composition ratio of the SiGe is changed with a constant gradual gradient; a method of using a buffer layer in which the Ge (germanium) composition ratio is changed in steps (step-shape); a method of using a buffer layer in which the Ge composition ratio is changed in the manner of a superlattice; and a method in which a Si off-cut wafer is used, and a buffer layer is used in which the Ge composition ratio is changed with a constant gradient (Patent References 1 through 4).

The Patent References are as follows.
Patent Reference 1: U.S. Pat. No. 5,442,205
Patent Reference 2: U.S. Pat. No. 5,221,413
Patent Reference 3: International Patent No. 98/00857
Patent Reference 4: Japanese Patent Laid-open No. 6-252046

However, the following problems remain in the above-described technology of the prior art.

That is, the crystallinity of the SiGe deposited as a film using the above-described conventional techniques is in a poor state, with the threading dislocation density not reaching the level desired for devices. Furthermore, with respect to surface roughness which can cause defects when actually manufacturing a device, it has been difficult to obtain satisfactory substrates with a low dislocation density. The surface roughness is the consequence of the effect of irregularities, extending to the surface, which arise due to internal dislocations.

For example, when using a buffer layer in which the Ge composition ratio has a gradient, the threading dislocation density can be made comparatively low, but there is the problem that the surface roughness worsens; conversely, when using a buffer layer in which the Ge composition ratio is changed in a step-like fashion, the surface roughness can be made comparatively small, but there is the problem that the threading dislocation density increases. Furthermore, when an off-cut wafer is used, dislocations tend to emerge laterally rather than in the film thickness direction, but a sufficiently low dislocation density is not achieved.

Moreover, in processes to manufacture devices on a Si layer or similar deposited on a SiGe layer, various heat treatments are performed, and there is the problem that at this time the roughness at the surfaces and interfaces of the SiGe layer and Si layer is worsened.

DISCLOSURE OF THE INVENTION

This invention was devised in light of the above problems, and has as an object the provision of a semiconductor substrate and a field effect transistor with low threading dislocation density and low surface roughness, and which can prevent worsening of the roughness of surfaces and interfaces during heat treatment in device manufacturing processes, as well as a method for forming a SiGe layer, a method for forming a strained Si layer using the same, and a method for producing a field effect transistor.

A method for producing a semiconductor substrate of this invention is a method for producing a semiconductor substrate in which a SiGe layer is formed on a Si substrate, which resolves the above problems by having:

a step of repeating, a plurality of times, a process for epitaxially growing a SiGe gradient composition layer of which a Ge composition ratio is gradually increased from a Ge composition ratio of a base material and a process for epitaxially growing a SiGe constant-composition layer on said gradient composition layer at a final Ge composition ratio of said gradient composition layer, thereby depositing a SiGe layer of which a Ge composition ratio changes in a film deposition direction, in a step-like manner with a gradient;

a heat treatment step of performing heat treatment at a temperature exceeding a temperature of said epitaxial growth either during or after formation of said SiGe layer; and a polishing step of polishing to remove irregularities on a surface of said SiGe layer which arise in said heat treatment after formation of said SiGe layer.

In the SiGe layer formation process of this invention, means for repeating the step for epitaxially growing the gradient composition layer and the constant-composition layer two to seven times, and means for repeating the step of epitaxially growing the gradient composition layer and of the constant-composition layer three times or four times, can be adopted.

In this invention, it is preferable that after the polishing step, a strained Si layer is grown epitaxially either directly on the SiGe layer, or through an intermediary of other SiGe layer.

A method for producing a field effect transistor of this invention includes forming a channel region in a strained Si layer grown epitaxially on a SiGe layer, and resolves the above-described problems by forming the channel region in the strained Si layer of a semiconductor substrate produced by the above-described method for producing a semiconductor substrate.

A semiconductor substrate of the invention includes a SiGe buffer layer formed on a Si substrate and has a plurality of layers, in a stacked state in alternation, of a SiGe gradient composition layer of which a Ge composition ratio increases gradually from a Ge composition ratio of a base material and a SiGe constant-composition layer deposited on the gradient composition layer and at a Ge composition ratio of a surface of said gradient composition layer, and the semiconductor substrate resolves the above-described problems by being produced using any one of the above-described methods for producing the semiconductor substrate.

In a semiconductor substrate of this invention, means can be adopted for configuring the SiGe buffer layer as a layered state of two to seven pairs of layers, each pair of layers having a gradient composition layer and a constant-composition layer, and means can be adopted for configuring the SiGe buffer layer as a layered state of either three or four pairs of layers, each pair of layers having a gradient composition layer and a constant-composition layer.

In a semiconductor substrate of this invention, the SiGe buffer layer can be set such that thicknesses of the gradient composition layers and the constant-composition layers are gradually decreased from a Si substrate side.

Furthermore, a semiconductor substrate in which a strained Si layer is formed on a Si substrate through an intermediary of a SiGe layer can be produced using the above-described methods for producing the semiconductor substrate.

A field effect transistor of this invention is a field effect transistor in which a channel region is formed in a strained Si layer grown epitaxially on a SiGe layer, and which resolves the above problems by being produced by the above-described method for producing the field effect transistor.

The inventors discovered as a result of research on techniques for deposition of SiGe that when depositing a SiGe layer, dislocations occurring in the crystal during deposition have the following tendencies in relation to the film composition.

(1) In a constant-composition layer, dislocations tend to propagate/thread toward the film surface along the {111} plane.

(2) At the layer interface of constant-composition layers with different compositions, numerous dislocations occur.

(3) At the layer interface of constant-composition layers with different compositions, dislocations readily propagate in lateral directions (directions perpendicular to the deposition direction; the <110> direction), however there also exist numerous dislocations which propagate/thread toward the film surface along the {111} plane.

(4) In a composition gradient layer, dislocations propagate/thread toward the film surface at a smaller and more gradual angle than along the {111} plane.

Hence when a film is deposited with the Ge composition ratio in a simple step-like profile, numerous dislocations occur at high density at the interfaces at which the composition changes suddenly, and in addition, it is thought that the dislocations become dislocations which propagate in the <110> direction perpendicular to the deposition direction, and dislocations which propagate/thread toward the film surface along the {111} plane. Moreover, if a film is deposited with the Ge composition ratio in a simple gradient profile, dislocations propagate toward the film surface at a smaller and more gradual angle than the {111} plane, however because there are no interfaces at which the composition changes suddenly, there is little effect of causing dislocations to be efficiently directed in the <110> direction perpendicular to the deposition direction, and as a result, it is thought that numerous dislocations reach the film surface.

On the other hand, when using a method for forming a SiGe layer of this invention, a process of epitaxially growing a SiGe gradient composition layer in which a Ge composition ratio is gradually increased from a Ge composition ratio of a base material (when the base on which the layer is grown is Si substrate, Si; in the case of a constant-composition layer, SiGe), and a process of epitaxially growing a constant-composition SiGe layer on the gradient composition layer having a final Ge composition ratio of the gradient composition layer, are repeated a plurality of times. Moreover, a semiconductor substrate of this invention includes a SiGe buffer layer having a plurality of alternating layers of the gradient composition layer and the constant-composition layers. Therefore, a plurality of alternations of the gradient composition layers and the constant-composition layers form a Ge composition ratio profile with a gradient-step shape, and consequently a SiGe layer can be formed with low dislocation density and minimal surface roughness.

That is, at interfaces dislocations readily propagate in lateral directions, and threading dislocations do not readily occur. Moreover, composition changes at interfaces are small, so that the occurrence of dislocations at interfaces is suppressed, dislocations occur uniformly within the gradient composition layers, thereby worsening of the surface roughness can be suppressed.

It is preferable that a semiconductor substrate of this invention includes the SiGe buffer layer having two to seven pairs of two layers of the gradient composition layer and the constant-composition layer, in a stacked state.

It is preferable that in a method for forming a SiGe layer of this invention, the step of epitaxially growing the gradient composition layer and the constant-composition layer is repeated two to seven times. That is, in the case in which one step includes a single formation of the gradient composition layer and the constant-composition layer, as explained below, when the number of the steps is increased, there is a number of the steps in which threading dislocation density declines. When the gradient composition layer and the constant-composition layer are formed repeatedly in two to seven steps, the threading dislocation density can be lowered to a half or less of the density for a single step.

It is preferable that a semiconductor substrate of this invention includes the SiGe buffer layer having either three or four pairs of two layers of the gradient composition layer and the constant-composition layer, in a stacked state.

It is preferable that in a method for forming a SiGe layer of this invention, the step of epitaxially growing the gradient composition layer and the constant-composition layer is repeated three or four times. That is, as explained below, there is an optimum number of the steps in which surface roughness declines most. When the gradient composition layer and the constant-composition layer are formed repeatedly in three or four steps, the surface roughness can be made to decline most.

It is also effective that in a semiconductor substrate of this invention, thicknesses of the gradient composition layers and the constant-composition layers are gradually decreased from a Si substrate side.

It is also effective that in a method for forming a SiGe layer of this invention, in the step of epitaxially growing the gradient composition layer and the constant-composition layer, thicknesses of the gradient composition layer and the constant-composition layer are gradually decreased upon each repetition. That is, because dislocations occur more readily at higher Ge composition ratios, in the case in which film deposition is repeated at the same thickness, the upper the layer is, the greater the number of dislocations occurs. Whereas in this invention, by gradually reducing the thicknesses of the gradient composition layers and the constant-composition layers upon each repetition, occurrence of dislocations in each of the layers can be made more uniform.

A semiconductor substrate of this invention is a semiconductor substrate including a SiGe layer formed on a Si substrate, wherein the SiGe layer is formed by the above-described method for forming the SiGe layer of this invention. That is, because in this semiconductor substrate the SiGe layer is formed by the above-described method for forming the SiGe layer of this invention, a good-quality SiGe layer is obtained with low dislocation density and minimal surface roughness, thereby the semiconductor substrate of this invention is favorable for, for example, a substrate for forming a strained Si layer on the SiGe layer.

A semiconductor substrate of this invention includes a strained Si layer on the SiGe buffer layer of the above-described semiconductor substrate of this invention, either directly or through an intermediary of other SiGe layer.

Furthermore, a method for forming a strained Si layer of this invention is a method for forming a strained Si layer on a Si substrate through an intermediary of a SiGe layer, which includes a step of epitaxially growing a SiGe buffer layer on the Si substrate by the above-described method for forming the SiGe layer of this invention, and a step of epitaxially growing a strained Si layer on the SiGe buffer layer, either directly or through an intermediary of other SiGe layer.

Furthermore, a semiconductor substrate of this invention is a semiconductor substrate in which a strained Si layer is formed on a Si substrate through an intermediary of a SiGe layer, and is characterized in that the strained Si layer is formed by the above-described strained Si layer formation method of this invention.

The above semiconductor substrate includes the strained Si layer positioned on the SiGe buffer layer of the above-described semiconductor substrate of this invention, either directly or through an intermediary of other SiGe layer. The above method for forming the strained Si layer includes epitaxially growing the strained Si layer on the SiGe buffer layer grown epitaxially using the above method for forming the SiGe layer of this invention, either directly or through an intermediary of other SiGe layer. In the above semiconductor substrate, the strained Si layer is formed using the above method for forming the strained Si layer of this invention.

Therefore, a Si layer can be formed on the SiGe layer with a satisfactory surface state, enabling formation of a good-quality strained Si layer. For example, such a substrate is appropriate as a substrate of an integrated circuit using MOSFETs or similar which employ the strained Si layer as a channel region.

In these method for producing the semiconductor substrate and the semiconductor substrates, heat treatment is performed at a temperature exceeding a temperature of an epitaxial growth either during or after formation of the SiGe layer, and irregularities on a surface of the SiGe layer which arise in the heat treatment after formation of the SiGe layer are polished to remove. Therefore, a pre-thermal history is imparted to the substrate in advance to cause worsening of a surface roughness due to a lattice relaxation and a dislocation motion, and the irregularities caused by the worsening the surface roughness are polished to remove, thereby a surface is smoothed. Therefore, even when heat treatments are performed in processes to manufacture devices on the substrate, worseness of the roughness at surfaces and at interfaces arising again can be prevented.

In a method for producing a semiconductor substrate and a semiconductor substrate of this invention, after the polishing step, the strained Si layer is grown epitaxially on the SiGe layer either directly or through an intermediary of other SiGe layer, so that the Si layer is grown on the SiGe layer with a satisfactory surface state, and a good-quality strained Si layer can be obtained.

A field effect transistor of this invention includes a channel region formed in a strained Si layer grown epitaxially on a SiGe layer, wherein the channel region is formed in the above-described strained Si layer of the semiconductor substrate of this invention.

A method for producing a field effect transistor of this invention comprising forming a channel region in a strained Si layer grown epitaxially on a SiGe layer, wherein the strained Si layer is formed using the above-described method for forming the strained Si layer of this invention.

A field effect transistor of this invention includes a channel region formed in a strained Si layer grown epitaxially on a SiGe layer, wherein the strained Si layer is formed using the above-described method for forming the strained Si layer of this invention.

In the above field effect transistors and methods for producing the field effect transistor, the channel region is formed in the above strained Si layer of the semiconductor substrate of the invention, or the strained Si layer in which the channel region is formed is formed using the above-described method for forming the strained Si layer of this invention, so that by means of a good-quality strained Si layer, a field effect transistor with satisfactory characteristics can be obtained with high manufacturing yields.

Furthermore, in these field effect transistors and methods for producing the field effect transistor of this invention, channel region is formed in the strained Si layer of the semiconductor substrate of this invention or of the semiconductor substrate produced by the method for producing the semiconductor substrate of this invention has the channel region, thereby even when heat treatments are performed in processes to manufacture devices, a good-quality strained Si layer is obtained on the SiGe layer with a satisfactory surface state, and a field effect transistor with satisfactory characteristics can be obtained with high manufacturing yields.

BEST MODE FOR CARRYING OUT THE INVENTION

A first aspect of a semiconductor substrate and a method for producing the semiconductor substrate of the invention is explained below with reference to the drawings.

Figure 1:
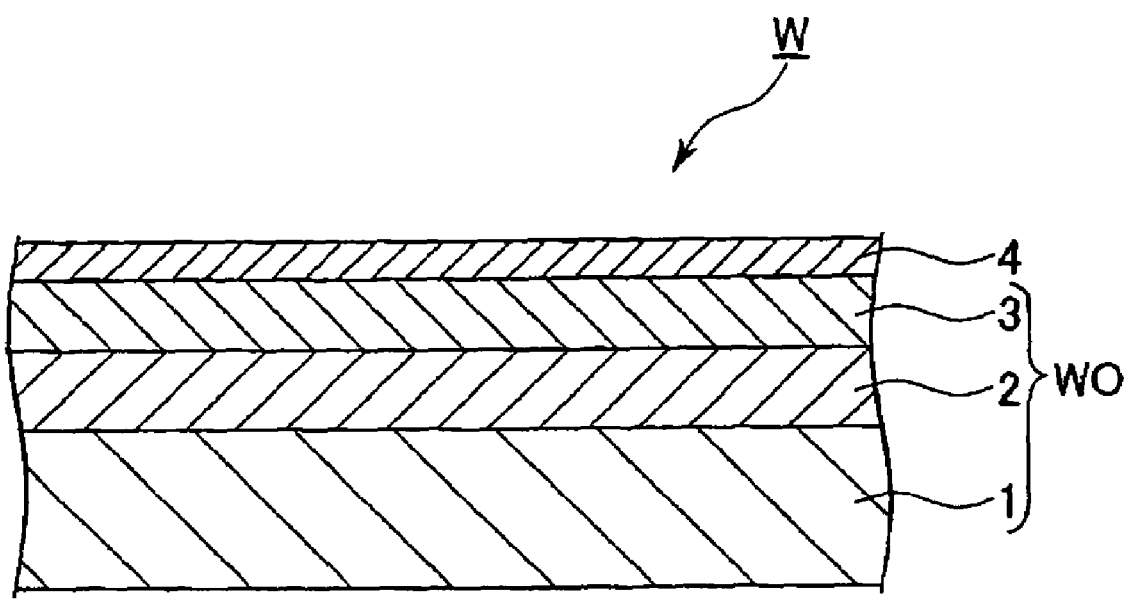
FIG. 1 is a cross-sectional view showing a semiconductor wafer in a first aspect of the invention.

FIG. 1 shows a cross-sectional view of a semiconductor wafer (semiconductor substrate) W including a semiconductor wafer (semiconductor substrate) W0 and strained Si layer of this invention.

The structure of this aspect are explained together with the method for producing the semiconductor wafer. First, as shown in FIG. 1, on Si substrate 1 produced by pulling using the CZ method, a $Si_{1-x}Ge_x$ step-gradient layer (SiGe buffer layer) 2, of which a Ge composition ratio x changes 0 to y (in which for example y=0.3) in a film deposition direction in a step-like manner with a gradient is epitaxially grown using a reduced-pressure CVD method. Here, in this film deposition using the reduced-pressure CVD, $H_2$ is employed as a carrier gas, and $SiH_4$ and $GeH_4$ are used as source gases.

Figure 2:
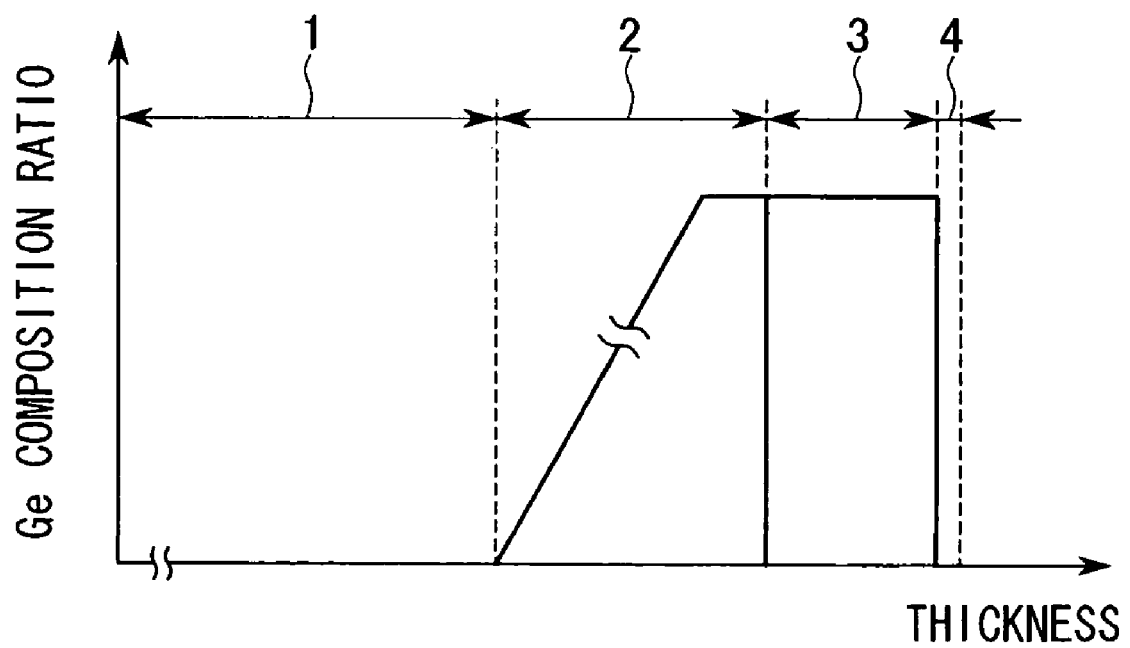
FIG. 2 is a graph showing a Ge composition ratio versus film thickness of a semiconductor substrate including a strained Si layer in a first aspect of the invention.

Next, as shown in FIG. 2, a $Si_{1-y}Ge_y$ buffer layer (second SiGe layer) 3 with constant Ge composition ratio is epitaxially grown on the step-gradient layer (first SiGe layer) 2, thereby the semiconductor wafer W0 is formed. The first SiGe layer 2 and the second SiGe layer 3 function as SiGe buffer layers for deposition of a strained Si layer.

Furthermore, as shown in FIG. 2, by growing Si epitaxially on the $Si_{1-z}Ge_z$ buffer layer 3 of which Ge composition ratio is z (in this aspect, z=y) to form a strained Si layer 4, a semiconductor wafer W including the strained Si layer of this aspect is produced. Here, film thicknesses of layers may for example be 1.5 μm for the step-gradient layer 2, 0.7 to 0.8 μm for the buffer layer 3, and 15 to 22 nm for the strained Si layer 4.

Figure 3:
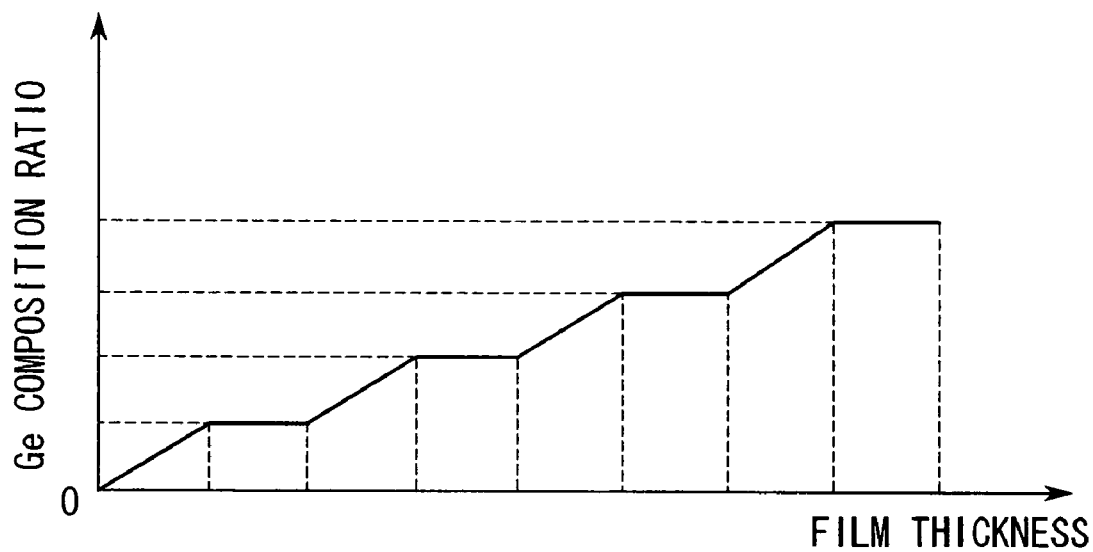
FIG. 3 is a graph showing a Ge composition ratio versus film thickness of a step-gradient layer in a first aspect of the invention.
Figure 4:
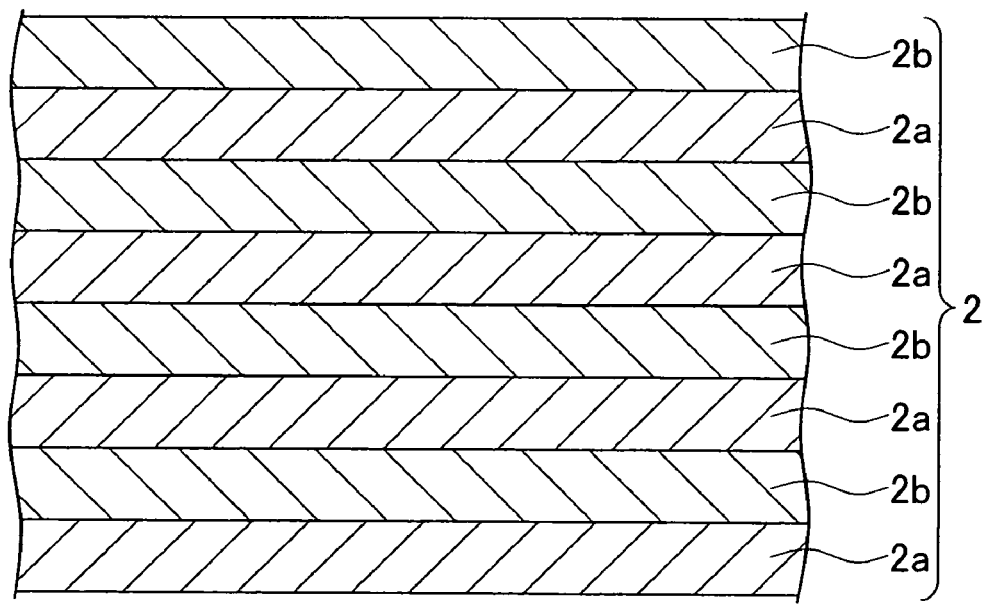
FIG. 4 is a cross-sectional view showing a step-gradient layer in a first aspect of the invention.

Deposition of the step-gradient layer 2 is performed by repeating, a plurality of times, a process for epitaxially growing a gradient composition layer 2a in which a Ge composition ratio is gradually increased from a Ge composition ratio of a base material to a prescribed value, and a process for epitaxially growing a constant-composition SiGe layer 2b of which a Ge composition ratio is a final Ge composition ratio of the gradient composition layer 2a, as shown in FIG. 3 and FIG. 4.

For example, in this aspect, the step-gradient layer 2 is formed by repeating four times the processes for epitaxially growing the gradient composition layers 2a and the constant-composition layers 2b. That is, when the process for epitaxially growing one gradient composition layer 2a and one constant-composition layer 2b is taken as one step, as a first step, a first gradient composition film 2a is grown on a Si substrate 1 with a Ge composition ratio increased gradually from 0 to 0.075, and on a top thereof, a first constant-composition layer 2b is formed with a Ge composition ratio of 0.075. Next, as a second step, a second gradient composition layer 2a is grown with a Ge composition ratio increased gradually from 0.075 to 0.15 on a top of the first constant-composition layer 2b of which the Ge composition ratio is 0.075, then on a top thereof, a second constant-composition layer 2b with a Ge composition ratio of 0.15 is formed.

As a third step, a third gradient composition layer 2a is grown with a Ge composition ratio increased gradually from 0.15 to 0.225 on the second constant-composition layer 2b of which the Ge composition ratio is 0.15, then on a top thereof, a third constant-composition layer 2b with Ge composition ratio of 0.225 is formed. And as a final step, a fourth gradient composition layer 2a is grown with a Ge composition ratio gradually increased from 0.225 to 0.3 on the third constant-composition layer 2b of which the Ge composition ratio is 0.225, then on a top thereof, a fourth constant-composition layer 2b is formed with a Ge composition ratio of 0.3. Here, film thicknesses of all the gradient composition layers 2a and the constant-composition layers 2b are set to be the same.

The above-described process of epitaxially growing the gradient composition layer 2a and the constant-composition layer 2b is repeated four times (four steps) because both threading dislocation density and surface roughness can be reduced. That is, a relation between the number of steps when repeating the epitaxial growth process and the threading dislocation density at a film surface based on experimental results shows that the threading dislocation density is reduced to one-half or less in a number of steps between 2 and 7. Also from the experimental results, a relation between the number of steps and surface roughness shows that the surface roughness is lowest in three or four steps. When the process of epitaxially growing the gradient composition layer 2a and the constant-composition layer 2b is repeated a plurality of steps, both the threading dislocation density and the surface roughness are lowered compared with a single step. Both characteristics tend to have minimal value, and when the number of steps is set to be four, both the threading dislocation density and the surface roughness can be effectively reduced.

Figure 5A:
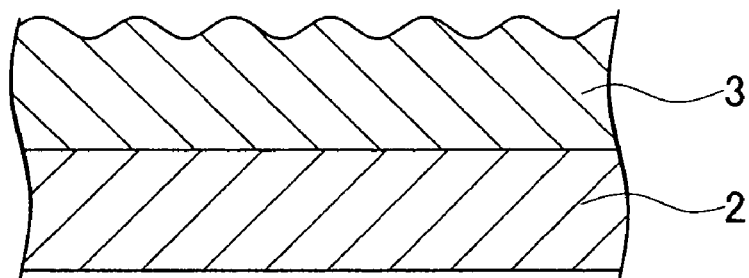
FIG. 5 is a cross-sectional view showing an order of processes for heat treatment, polishing, and forming a strained Si layer in one aspect of the invention.

As shown in FIG. 5A, either during or after formation of the first SiGe layer 2 and the second SiGe layer 3, heat treatment is performed, and the surface roughness of the SiGe layer is caused to be worsened in advance. For example, heat treatment conditions are set in which a temperature of 800° C. to 1100° C., exceeding the SiGe layer epitaxial growth temperature, and a heat treatment time of 1 minute to 200 minutes. Here, in this aspect, during deposition of the second SiGe layer 3, supply of the source gas is halted and deposition is stopped temporarily, and in this state, annealing is performed to heat up to 1000° C. and to keep the temperature for 10 minutes. After this annealing treatment, the temperature falls to the deposition temperature of the second SiGe layer 3, the supply of the source gas is again resumed, and the remaining film deposition is performed.

Figure 5B:
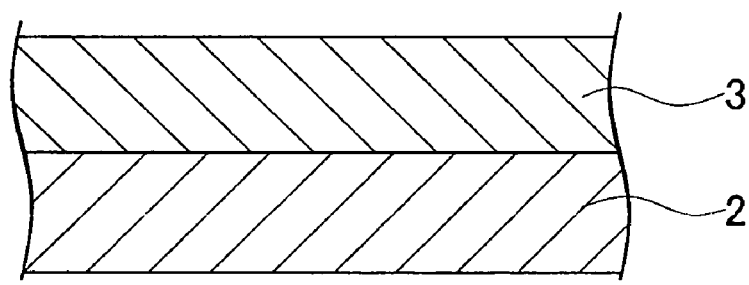

Next, the surface of the second SiGe layer 3 on which irregularities have appeared due to worsening of the surface roughness resulting from the heat treatment, is subjected to CMP (Chemical Mechanical Polishing) and other polishing as shown in FIG. 5B to flatten the surface and to remove the irregularities due to worsening of the surface roughness.

Here, the film thicknesses of the above first SiGe layer 2 and the second SiGe layer 3 are, for example, 1.5 μm and 0.75 μm respectively.

Figure 5C:
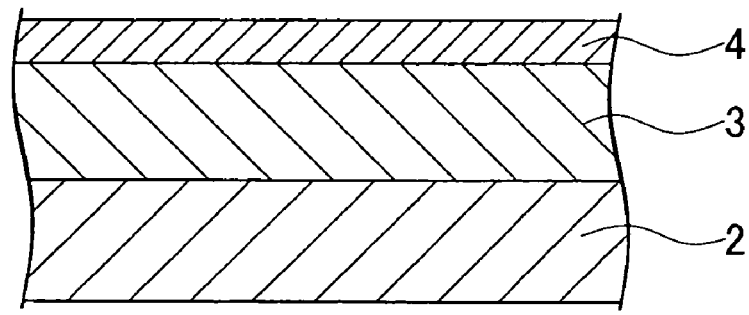

Then, as shown in FIG. 5C, a Si layer is grown epitaxially on a polished second SiGe layer 3 to form a strained Si layer 4, thus completing the semiconductor wafer W.

In the semiconductor wafer W0 and the semiconductor wafer W including the strained Si layer of this aspect, a process of epitaxially growing the SiGe gradient composition layer 2a in which the Ge composition ratio is increased gradually from the Ge composition ratio of the base material (when the base on which the film is grown is the Si substrate 1, silicon; when the base is the constant-composition layer 2b, SiGe), and a process of epitaxially growing the SiGe constant-composition layer 2b on the gradient composition layer 2a at the final Ge composition ratio of the gradient composition layer 2a are repeated a plurality of times, thereby the gradient composition layers 2a and the constant-composition layers 2b are formed a plurality of times in alternation to be a layer of which the Ge composition profile has a gradient-step shape. Therefore, as explained above, a SiGe layer can be formed with a low dislocation density and a minimal surface roughness.

That is, in this aspect, the above-described film deposition method can be used to deposit a SiGe layer in which the dislocations necessary for lattice relaxation are distributed uniformly and dislocations are caused to propagate in lateral directions insofar as possible to prevent threading toward the surface, thereby a satisfactory surface state can be obtained.

Furthermore, in this aspect, the heat treatment is performed at a temperature exceeding the epitaxial growth temperature either during or after formation by epitaxial growth of the second SiGe layer 3, and surface irregularities arising from the heat treatment are removed by polishing after formation of the second SiGe layer 3, thereby a thermal history is imparted to the substrate in advance to cause worsening of the surface roughness due to a lattice relaxation and a dislocation motion to occur in advance; consequently when performing the heat treatment during device manufacturing processes, the reoccurrence of worsening of roughness at the surface and at interfaces can be prevented.

Here, the constant-composition layer 2b in the uppermost position and the second SiGe layer 3 can be made the same composition, and/or the constant-composition layer 2b in the uppermost position and the second SiGe layer 3 can be formed continuously. In this case, the above-described heat treatment and the CMP processing can also be performed after formation of the constant-composition layer 2b in the uppermost position. Furthermore, the above-described heat treatment and the CMP processing can also be performed prior to the formation of the constant-composition layer 2b in the uppermost position, that is, after formation of the gradient composition layer 2a in the uppermost position.

The heat treatment and the CMP processing can be performed by an arbitrary process during formation of the first SiGe layer 2 and the second SiGe layer 3, and the heat treatment and/or the CMP processing can also be performed a plurality of times in different processes.

Next, a field effect transistor (MOSFET) using the semiconductor substrate of the above aspect of the invention is explained, together with a method for producing the same with reference to the drawings.

Figure 6:
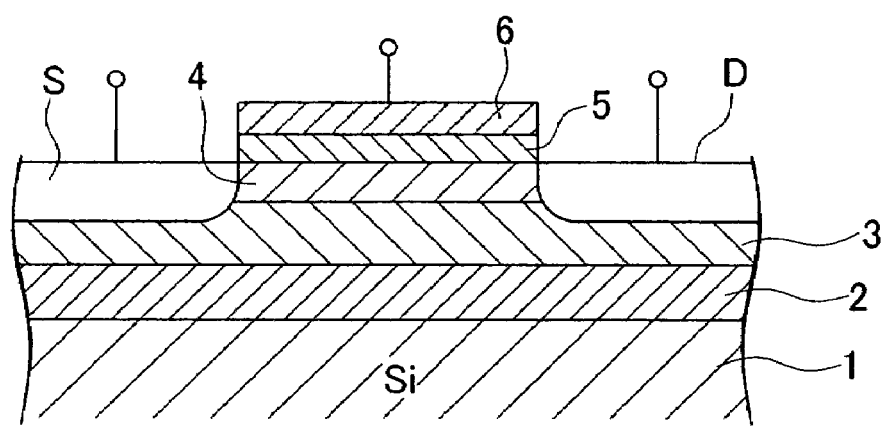
FIG. 6 is a schematic cross-sectional view showing a MOSFET in one aspect of the invention.

FIG. 6 shows a schematic structure of a field effect transistor of this invention. When producing this field effect transistor, a $SiO_2$ gate oxide film 5 and a gate polysilicon film 6 are deposited in order on the strained Si layer 4 in the surface of the semiconductor wafer W which includes the strained Si layer formed in the above manufacturing processes. A gate electrode (not shown) is then patterned and formed on the portion which is to become a channel region on the gate polysilicon film 6.

Next, the gate oxide film 5 is also patterned and portions other than portions under the gate electrode are removed. By ion implantation using the gate electrode as a mask, an n-type or a p-type source region S and a drain region D are formed in self-aligning in the strained Si layer 4 and the second SiGe layer 3. After that, source electrodes and drain electrodes (not shown) are formed on the source region S and the drain region D respectively, to complete an n-type or a p-type MOSFET in which the strained Si layer 4 is the channel region.

In a MOSFET produced in this way, the channel region is formed in the strained Si layer 4 of the semiconductor wafer W including the strained Si layer produced by the above-described manufacturing method, thereby even in the case in which a heat treatment is performed during device manufacture, there is no worsening of the roughness at the surface or at the interfaces, and by means of a good-quality strained Si layer 4, a MOSFET with excellent operating characteristics can be obtained with high yield. For example, when forming the gate oxide film 5, the semiconductor wafer W is heated in order to form a thermal oxide film, however, because the semiconductor wafer W has already been subjected to thermal history in advance, there is no worsening of the roughness at the surface or at the interfaces of the SiGe layer or the strained Si layer during a thermal oxide film formation.

A second aspect of a semiconductor substrate and a method for producing the semiconductor substrate of the invention is explained below with reference to the drawings.

Figure 7:
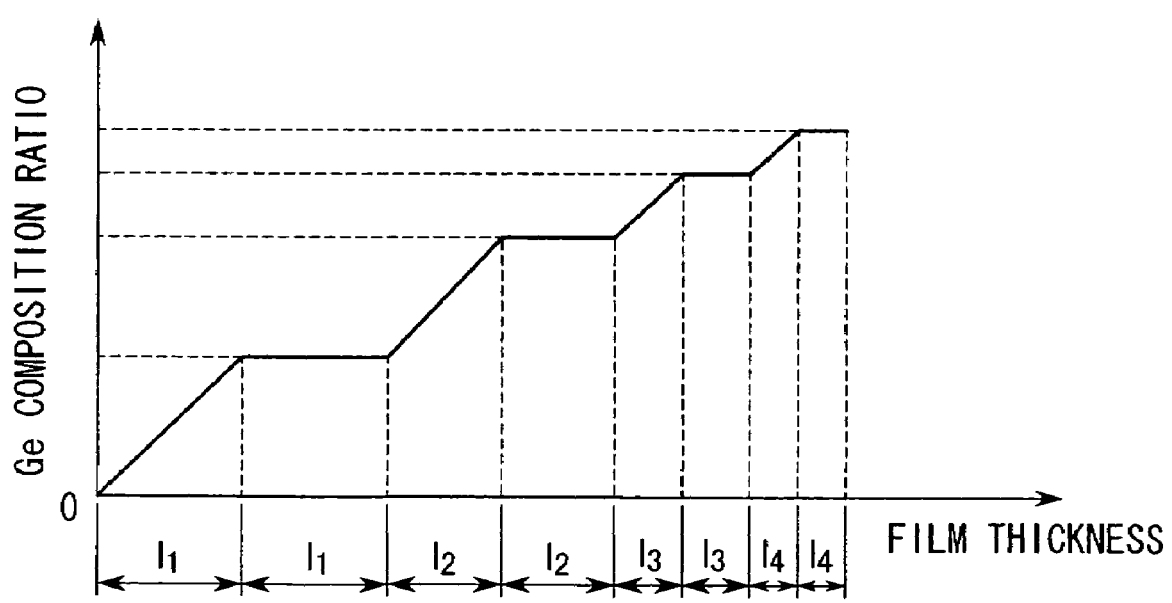
FIG. 7 is a graph showing a Ge composition ratio versus film thickness of a step-gradient layer in a second aspect of the invention.
Figure 8:
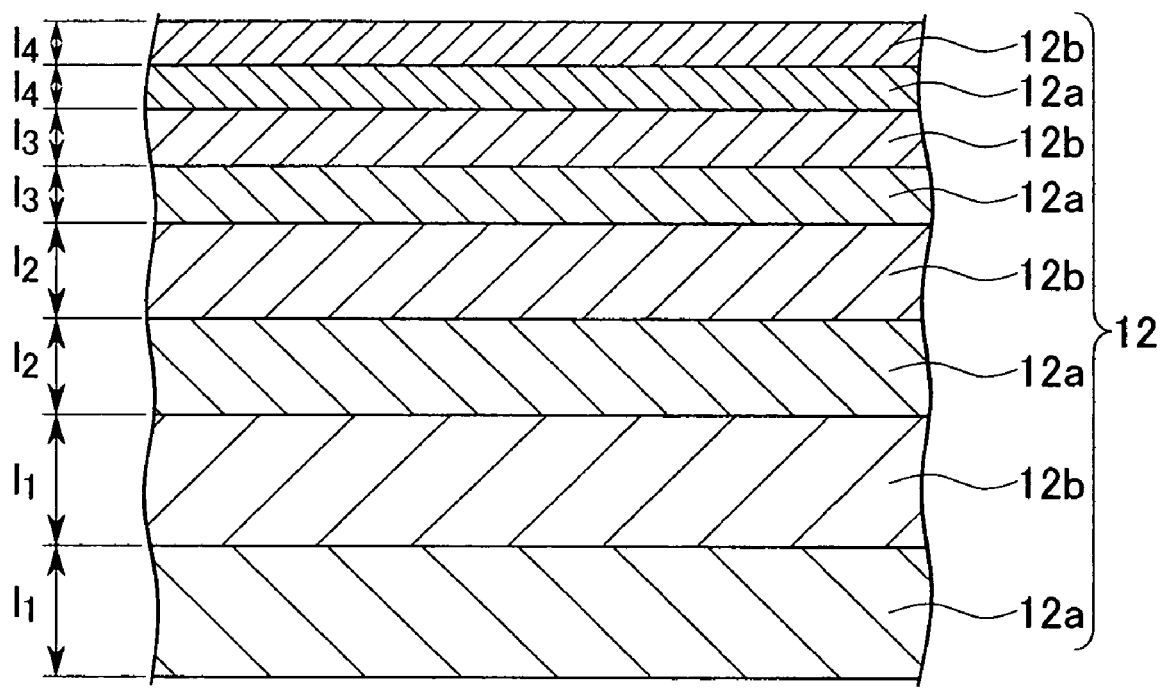
FIG. 8 is a cross-sectional view showing a step-gradient layer in a second aspect of the invention.

The following is a difference between the second aspect and the first aspect. Whereas in the step-gradient layer (first SiGe layer) of the first aspect, the film thickness of the gradient composition layer 2a and that of the constant-composition layer 2b were set to be the same, in the step-gradient layer (first SiGe layer) 1 of the second aspect, in the process of epitaxially growing a gradient composition layer 12a and a constant-composition layer 12b, the thicknesses of the constant-composition layer 12a and the constant-composition layer 12b are gradually decreased upon each repetition to form a step-gradient layer 12, as shown in FIG. 7 and FIG. 8.

That is, in this aspect, in the process of epitaxially growing the gradient composition layer 12a and the constant-composition layer 12b, after growing a first gradient composition layer 12a and a first constant-composition layer 12b, a second gradient composition layer 12a and a second constant-composition layer 12b are grown which are thinner than the first gradient composition layer 12a and the first constant-composition layer 12b. Similarly, a third gradient composition layer 12a and a third constant-composition layer 12b are grown which are thinner than the second gradient composition layer 12a and the second constant-composition layer 12b. Finally, a fourth gradient composition layer 12a and a fourth constant-composition layer 12b are grown which are thinner than the third gradient composition layer 12a and the third constant-composition layer 12b to complete formation of the step-gradient layer 12.

That is, when $l_1$ is the first gradient composition layer 12a and the first constant-composition layer 12b, $l_2$ is the second gradient composition layer 12a and the second constant-composition layer 12b, $l_3$ is the third gradient composition layer 12a and the third constant-composition layer 12b, and $l_4$ is the fourth gradient composition layer 12a and the fourth constant-composition layer 12b, layering is performed with film thicknesses of $l_1 > l_2 > l_3 > l_4$.

Here, critical film thickness for occurrence of dislocations changes depending on a Ge composition ratio, however each of the above layers is made thicker than this critical film thickness, thereby dislocations necessary for lattice relaxation occur uniformly in each layer.

Also, the gradient of the Ge composition ratio in each of the gradient composition layers 12a is set to be the same.

As explained above, the dislocations tend to occur more readily at higher Ge composition ratios. Whereas when films of the same thickness are deposited repeatedly as in the first aspect, dislocations occur in greater numbers in the upper layers, however, when the thickness of the gradient composition layer 12a and that of the constant-composition layer 12b are reduced gradually upon each repetition as in this aspect, dislocations can be made to occur more uniformly in each layer.

Here, the technical scope of this invention is not limited to the above aspects, and various modifications can be made without deviating from the gist of the invention.

For example, this invention also includes a semiconductor substrate further including a SiGe layer on the strained Si layer 4 of the semiconductor wafer W of the above aspects.

In each of the above aspects, the number of repetitions of the process of epitaxially growing the radient composition layer and the constant-composition layer was taken to be four (four steps), however a different number of steps may be employed. Here, as explained above, four is a number of repetitions at which both the threading dislocation density and the surface roughness are effectively reduced, however by setting the number of repetitions to a number of two to seven, the threading dislocation density can be reduced to half or less of the density for a single step, and by setting the number to three or four, the surface roughness can be minimized.

For example, in the above aspects, the heat treatment of the SiGe layer was performed during the formation of the second SiGe layer 3, however the heat treatment may be performed during the formation of the first SiGe layers 2 and 12 or after the formation of the second SiGe layer 3. Moreover, the heat treatment may also be performed a plurality of times.

This invention also includes a semiconductor wafer further including a SiGe layer on the strained Si layer of the semiconductor wafer W which has a strained Si layer of the above aspects. Also, in the above aspects, the strained Si layer was deposited directly on the second SiGe layer, however other SiGe layer may be deposited on the second SiGe layer, and the strained Si layer may be grown epitaxially through an intermediary of the other SiGe layer.

Also, in the above aspects, the semiconductor substrate having the SiGe layer was fabricated for use as the MOSFET substrate, however use as a substrate for other applications is also possible. For example, the method for forming the SiGe layer and the semiconductor substrate of this invention may be applied to substrates for solar cells. That is, by depositing a SiGe gradient composition layer of which a Ge composition ratio is gradually increased to reach 100% of Ge at an uppermost surface on the silicon substrate of any of the above-described aspects, and then depositing GaAs (gallium arsenide) thereupon, a substrate for solar cells can be manufactured. In this case, a solar cell substrate with low dislocation density and excellent characteristics is obtained.

EXAMPLES

Next, observation results of TEM images of actually fabricated semiconductor substrates of this invention are explained.

First, for purposes of comparison, semiconductor wafers were fabricated using conventional technologies including a conventional technology (A) to deposit a SiGe layer of which a Ge composition ratio was increased in linear fashion and a conventional technology (B) to deposit a SiGe layer of which a Ge composition ratio was increased in steps, and cross-sectional TEM images of the comparative wafers were observed.

In the conventional technology (A), dislocations were observed in cross-sectional TEM images to be formed comparatively randomly, and almost no dislocations were observed in the upper layer with constant Ge composition ratio. Due to this, it is thought that a mechanism acts in which dislocations extend in lateral (wafer edge) directions. However, in observations of a surface after etching the surface using an etchant solution of a mixture of $HF/Cr_2O_3$/distilled water, numerous etch pits were observed, and the etch pits were thought to be dislocations which had threaded the surface.

On the other hand, in the conventional technology (B), dislocations were observed to be concentrated at places in which compositions changed, and from the cross-sectional TEM images and the etch pit observation results, it was found that dislocation densities at these places were also extremely high. In this case, it is also thought that a mechanism acts in which dislocations extend in lateral directions, however because dislocation nucleus formation density is originally extremely high, it is thought that dislocations extending toward the surface are also numerous, and that the threading dislocation density is high.

On the other hand, in the semiconductor wafer of this invention produced by the above aspects, that is, the semiconductor wafer in which the SiGe layer was formed with the Ge composition ratio increased in gradient steps, dislocations occurred uniformly in the gradient composition layers, and were observed to extend in lateral directions in comparatively ordered shape. Although it is thought that a mechanism of dislocations extending in lateral directions and a mechanism of dislocations extending toward the surface both act, it is thought that the above result occurs because dislocations extending toward the surface are drawn in lateral directions due to the effect of interfaces at which compositions are constant within a gradient composition.

Thus, in a semiconductor wafer produced by the method of this invention, dislocations tend not to be concentrated at the interfaces compared with conventional technology, and are observed in the TEM images to occur uniformly.

Next, worsening of the roughness at the surface and at the interfaces when heat treatment is performed according to the above aspects is explained concretely with reference to the drawings.

Based on the above aspects, heat treatment was performed during deposition of the second SiGe layer 3 in which an annealing temperature was 1000° C. and an annealing time is 10 minutes, and the remainder of the second SiGe layer 3 was deposited after the heat treatment. A wafer was similarly produced in which heat treatment was not performed, and was used as a comparative example in comparisons.

In this example, the RMS (Root Mean Square) of the surface roughness was found to be high, between 3.00 nm and 6.40 nm, compared with the comparative example. That is, by means of the above annealing treatment, the SiGe layer was subjected to a sufficient thermal history. Therefore, by using a polishing process to remove irregularities in the surface of this second SiGe layer, worsening of the roughness at the surface and at interfaces during heat treatment in device manufacturing processes can be prevented. When actually removing the irregularities in the second SiGe layer surface using the above-described polishing process, the RMS surface roughness was lowered to 0.60 nm. When after polishing the sample was subjected to heat treatment in which an annealing temperature is 1000° C. and an annealing time is 10 minutes, there was no worsening of the surface roughness.

Next, separately from the above example, an example in which annealing treatment is performed and a comparative example without annealing treatment were produced, and AFM (Atomic Force Microscope) measurements (of the roughness in real space) of both were performed.

Figure 9:
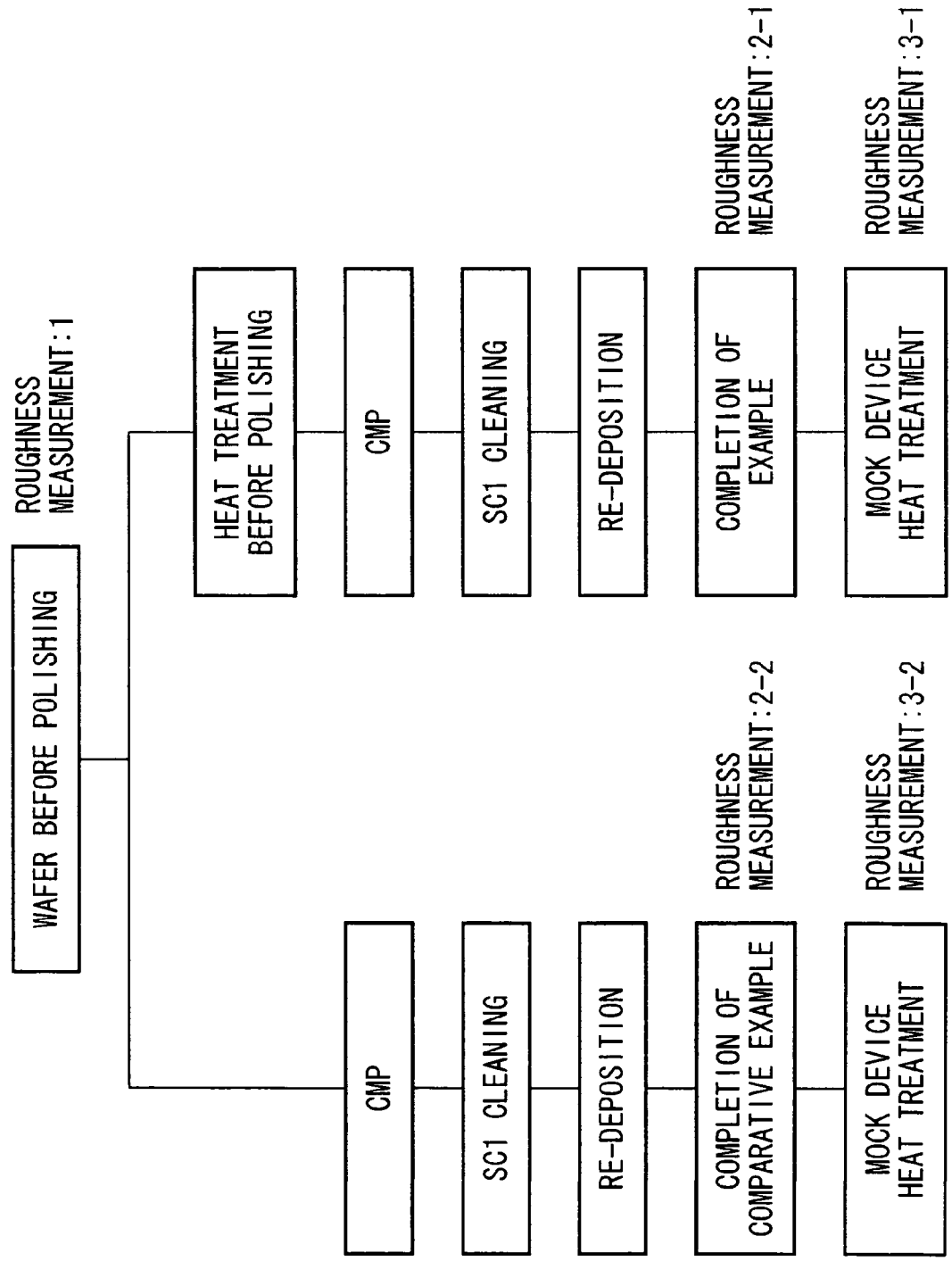
FIG. 9 shows a manufacturing flowchart for an example of the invention and a comparative example.

First, Si substrates 1 of which diameters were 200 mm were prepared, and a single-wafer reduced-pressure epitaxial growth apparatus was used to deposit films using a mixture of $SiH_4$ and $GeH_4$ with a carrier hydrogen gas under reduced pressure (5000 to 15000 Pa) and at temperatures in a range of 680 to 850° C. FIG. 9 is a flowchart of producing the example and the comparative example.

Prior to annealing treatment and polishing, a first SiGe layer 2, a second SiGe layer 3, and a strained Si layer 10 were deposited to thicknesses of 1.5 µm, 1.5 µm, and 20 nm, respectively. Here, a Ge composition ratio of the second SiGe layer was 0.30.

Next, the annealing treatment prior to the polishing was performed in a nitrogen gas flowing at 1100° C. for 30 minutes in a horizontal heat-treatment furnace.

The polishing (CMP treatment) after the annealing was performed to remove 0.5 µm, and after the polishing process an ordinary SC1 cleaning was performed.

After the SC1 cleaning, the second SiGe layer 3 was again deposited to a thickness of 0.2 µm under the same conditions as initially, and further, a strained Si layer 4 of thickness 20 nm was deposited.

Finally, in order to compare the heat resistance of this example and the comparative example, a horizontal heat-treatment furnace was used to perform heat treatment in a nitrogen gas flowing at 1100° C. for 30 minutes, as mock heat treatment during device manufacturing processes.

AFM measurements and measurements using a surface roughness gauge were performed for the example and the comparative example, produced as described above. Here, for comparison, the measurements were performed before polishing and before and after the mock device heat treatment.

The AFM measurements were performed over a scanning region measuring square 20 µm on a side, and the measurements using the surface roughness gauge were performed over a scanned line length of 1 mm, with a cutoff length of 0.1 mm, and with measurement steps of 0.2 µm.

The measurement results were as follows.

Roughness Measurement 1 (Example and Comparative Example: Wafers Prior to Polishing)
RMS: 4.84 nm
P-V value: 43.97 nm Roughness Measurement 2-1 (Example: Wafer Immediately After Re-deposition Following Polishing)
RMS: 0.68 nm
P-V value: 6.69 nm Roughness Measurement 2-2 (Comparative Example: Wafer Immediately After Re-deposition Following Polishing)
RMS: 1.91 nm
P-V value: 19.02 nm Roughness Measurement 3-1 (Example: Wafer After Mock Heat Treatment)
RMS: 0.95 nm
P-V value: 10.36 nm Roughness Measurement 3-2 (Comparative Example: Wafer After Mock Heat Treatment)
RMS: 2.27 nm
P-V value: 19.57 nm From the above results, it is seen that, compared with the comparative examples, the examples undergo extremely little change in RMS values after the mock heat treatment, and have satisfactory surface states.

That is, in this examples, it is shown that the worsening of micro-roughness due to thermal history is greatly improved compared with the comparative examples. It is known that in strained Si the micro-roughness strongly affects degradation of positive hole mobility, and it is clear that this invention makes possible an epochal improvement in the production of p-type transistors employing strained Si wafers (indispensable for CMOS device manufacturing).

INDUSTRIAL APPLICABILITY

By means of this invention, the following advantageous results are realized.

A semiconductor substrate of this invention includes a SiGe buffer layer configured as a plurality of gradient composition layers and constant-composition layers stacked in alternation; and in a method for forming a SiGe layer of this invention, a process of epitaxially growing a gradient composition layer and a process of epitaxially growing a constant-composition layer are repeated a plurality of times to deposit a SiGe layer in which a Ge composition ratio changes in step-like manner with a gradient in the film deposition direction. Consequently occurrence of dislocations concentrated at interfaces can be suppressed, and the dislocations can be caused to move in lateral directions and can be prevented from threading the surface.

Hence, film can be deposited in which dislocations necessary for lattice relaxation can be caused to occur uniformly and the surface roughness can be reduced, and in addition, dislocations can be made to move in lateral directions insofar as possible, and threading dislocations can be reduced, so that good-quality crystallinity can be obtained, with low threading dislocation density and low surface roughness.

Furthermore, a semiconductor substrate including a strained Si layer of this invention has a strained Si layer placed on a SiGe buffer layer of a semiconductor substrate of the invention, either directly or through an intermediary of other SiGe layer; and a method for forming a strained Si layer of this invention includes epitaxially growing a strained Si layer, either directly or through an intermediary of other SiGe layer, on a SiGe buffer layer grown epitaxially by a method for forming a SiGe layer of this invention.

Therefore, a Si layer can be deposited on the SiGe layer with a satisfactory surface state, and a good-quality strained Si layer can be formed.

In a semiconductor substrate and a method for producing a semiconductor substrate of this invention, heat treatment is performed either during or after formation of a SiGe layer by epitaxial growth, at a temperature exceeding the epitaxial growth temperature, and after the SiGe layer is formed, surface irregularities arising from the heat treatment are removed by polishing. Therefore, even in the case in which heat treatment is applied in device manufacturing processes on this substrate after the surface irregularities due to the previous thermal history have been removed by polishing, renewed worsening of the roughness at the surface and at interfaces can be prevented.

Furthermore, in a field effect transistor and a method for producing the same of this invention, a channel region exists in the strained Si layer of the above semiconductor substrate of the invention, or of a semiconductor substrate produced by the above method for producing a semiconductor substrate of the invention. Therefore, even in the case in which heat treatment is applied in device manufacturing processes, a good-quality strained Si layer is obtained on a SiGe layer with a satisfactory surface state, and a MOSFET with good characteristics can be obtained with high yield.

The invention claimed is:

1. A method for producing a semiconductor substrate in which a SiGe layer is formed on a Si substrate, said method comprising:
   repeating, a plurality of times, a process of epitaxially growing a SiGe gradient composition layer of which a Ge composition ratio is gradually increased from a Ge composition ratio of a base material and a process of epitaxially growing a SiGe constant-composition layer on said gradient composition layer at a final Ge composition ratio of said gradient composition layer, thereby depositing a SiGe layer of which a Ge composition ratio changes in a film deposition direction, in a step-like manner with a gradient;
   performing heat treatment at a temperature exceeding a temperature of said epitaxial growth either during or after formation of said SiGe layer; and
   polishing to remove irregularities on a surface of said SiGe layer which arise in said heat treatment after formation of said SiGe layer.

2. A method for producing a semiconductor substrate according to claim 1, wherein said epitaxially growing of said gradient composition layer and said constant-composition layer is repeated two to seven times.

3. A method for producing a semiconductor substrate according to claim 1, wherein said epitaxial growing of said gradient composition layer and said constant-composition layer is repeated either three or four times.

4. A method for producing a semiconductor substrate according to claim 1, wherein after said polishing, a strained Si layer is grown epitaxially on said SiGe layer, either directly or through an intermediary of other SiGe layer.

5. A method for producing a field effect transistor, said method comprising forming a channel region in a strained Si layer grown epitaxially on a SiGe layer, wherein said channel region is formed in said strained Si layer of a semiconductor substrate produced by said method for producing said semiconductor substrate according to claim 4.

6. A field effect transistor comprising a channel region formed in a strained Si layer grown epitaxially on a SiGe layer, wherein said field effect transistor is produced by said method for producing said field effect transistor according to claim 5.

7. A semiconductor substrate comprising a strained Si layer formed on a Si substrate through an intermediary of a SiGe layer, wherein said semiconductor substrate is produced by said method for producing said semiconductor substrate according to claim 4.

8. A semiconductor substrate comprising
   a SiGe buffer layer formed on a Si substrate and having a plurality of alternating layers, in a stacked arrangement, of a SiGe gradient composition layer of which a Ge composition ratio increases gradually from a Ge composition ratio of a base material and a SiGe constant-composition layer deposited on said gradient composition layer and at a Ge composition ratio of a surface of said gradient composition layer,
   wherein said semiconductor substrate is produced by said method for producing a semiconductor substrate according to claim 1.

9. A semiconductor substrate according to claim 8, wherein said SiGe buffer layer has two to seven pairs of two layers of said gradient composition layer and said constant-composition layer, in a stacked state.

10. A semiconductor substrate according to claim 8, wherein said SiGe buffer layer has either three or four pairs of the two layers of said gradient composition layer and said constant-composition layer, in a stacked state.

11. A semiconductor substrate according to claim 8, wherein in said SiGe buffer layer, thicknesses of said gradient composition layers and of said constant-composition layers are gradually decreased from a Si substrate side.

12. A method for producing a semiconductor substrate according to claim 1, wherein said heat treatment is performed at a temperature of about 800° C. to about 1000° C. for a time interval of about 1 minute to about 200 minutes.

* * * * *